CLASS B PUSH-PULL ELECTRICAL AMPLIFIER
Filed June 7, 1968
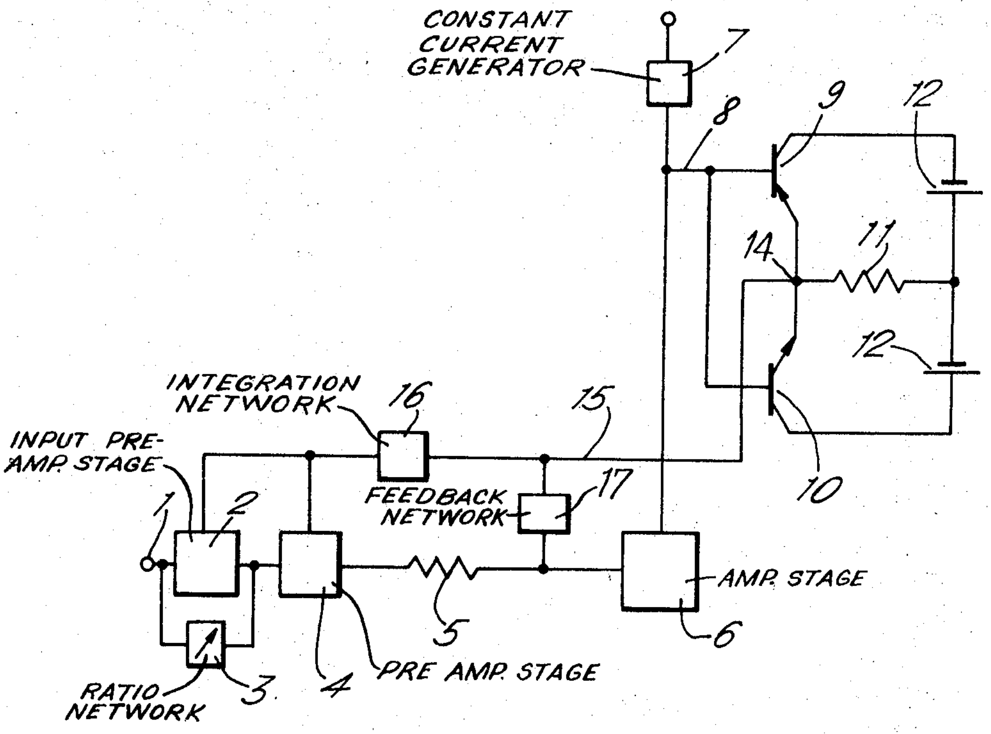
INVENTOR
GORDON MALCOLM EDGE
BY Cushman, Darby & Cushman
ATTORNEYS

United States Patent Office 3,529,253
Patented Sept. 15, 1970

3,529,253

CLASS B PUSH-PULL ELECTRICAL AMPLIFIER

Gordon Malcolm Edge, Cambridge, England, assignor to Cambridge Consultants Limited, Cambridge, England, a British company Filed June 7, 1968, Ser. No. 735,412
Claims priority, application Great Britain, June 10, 1967, 26,900/67
Int. Cl. H03f *3/04, 3/18, 3/26*
U.S. Cl. 330—13 6 Claims

ABSTRACT OF THE DISCLOSURE

An electrical amplifier which includes a transistor output stage arranged to be operated in class B and having two transistors connected to provide a push-pull output, and an amplifying stage feeding signals to the output stage, the amplifying stage being fed with current from a constant current generator source.

This invention relates to an electrical amplifier which includes a transistor output stage which may be operated in class B and which has two transistors connected to provide a push-pull output.

Such an output stage has particular, though not exclusive, application as a power amplifier in high fidelity reproduction equipment.

One of the problems encountered in the operation of this type of output stage is that produced by discontinuity in the output characteristic of the stage resulting from differences in the characteristics of the two transistors used and causing distortion in the output signal.

The present invention provides an amplifier having a circuit arrangement which minimizes this cross-over distortion resulting from the discontinuity in the characteristic of the output stage.

According to the present invention there is provided an electrical amplifier which includes a transistor output stage arranged to be operated in class B and having two transistors connected to provide a push-pull ouput, an amplifying stage, the output of which is connected to the input to the output stage, and a constant current generator connected to supply current to the amplifying stage.

An embodiment of the invention will now be described with reference to the single figure of the accompanying drawing which shows, partly in block schematic form, the circuit of an electrical amplifier.

Referring to the drawing there is shown an amplifier having an input terminal 1 connected to an input stage 2 of a preamplifier. Negative feedback between the output and the input of the stage 2 is provided via a network 3 having a variable input to output ratio whereby the amount of feedback may be varied. The output from the amplifier 2 is applied to the input of further stages 4 of the pre-amplifier. The output from the stages 4 is applied via a resistor 5 to the input of an amplifier stage 6, to which power is supplied from a constant current generator source 7. The output from the amplifier stage 6 is applied via a lead 8 to the bases of transistors 9 and 10 which are connected symmetrically and in a complementary manner in the common collector configuration to provide a push-pull output in a load resistor 11. Power is supplied to the output stage formed by the transistors 9 and 10 from batteries 12. The transistor 9 is of the pnp type and the transistor 10 is of the npn type.

Negative feedback is provided overall from the output stage to the input of the stage 6 via a network 17.

The constant current generator 7 may be a single transistor suitably biased to have an impedance large compared with that of the associated circuit impedances.

The function of the constant current generator is to minimize cross-over distortion arising from the discontinuity in the output characteristics of the power output stage provided by the transistors 9 and 10. The stage 6 is provided in the patricular embodiment by a transistor and the gain of this transistor may be maximized since its collector load is effectively the same as that of the input circuit of the output stage. In operation, the signal from the stage 6 effectively modulates the constant current source and therefore varies the signal current applied to the bases of the transistors 9 and 10.

The constant current generator source minimizes the effect of disturbances in the supply lines so that they do not influence the instantaneous base current of the ouput stage. The requirements for special filtering of the power supply are thus reduced for a praticular level of output hum from the amplifier.

Power is supplied to the pre-amplifier stages 2 and 4, via an integrator network 16 and a lead 15, from the common emitter junction point 14 of the transistors 9 and 10. The network 16 may, in fact, be included in the circuit configuration of the amplifiers 2 and 4. The integration network 16 prevents unwanted feedback effects from the output terminal junction point 14. Since the emitter voltage of a transistor operated in a common collector mode is effectively independent of the collector voltage over a wide range, the effect of taking a low level DC supply from the emitter junction point is to add additional power supply line filtering and further to minimize hum originating in the power supply. This circuit configuration therefore enables the cost of achieving a given specification to be minimized. Alternatively it is possible to provide an improved specification for a given cost compared with known arrangements.

The input to output ratio of the feedback network 3 between the output and the input of the amplifier 2 may be adjusted to provide a variable amount of feedback and it may therefore be used to control the gain of the input stage 2 of the amplifier.

Thus in operation, a signal applied to the input terminal 1 may be amplified in pre-amplifier stage 2 with a gain determined by the setting of the feedback ratio of the network 3. The ability to adjust the gain of the input stage in this maner enables the sensitivity of the amplifier to extend over a wide range and for input signals of a comparatively high level to be handled without overloading. The output from the stage 2 is applied via the stage 4 and the amplifying stage 6 to the bases of the transistors 9 and 10 operating in class B and forming the power amplifier output stage and the output signals are developed across the load 11. Power for the stages 2 and 4 is obtained from the terminals 14 and applied via the lead 15 and the integrating network 16 to the power supply lines of the stages 2 and 4 in the manner described above.

It is not essential that the symmetrically connected transistors in the output stage should be connected in the common collecor mode. They could be connected in the common emitter configuration though with such an arrangement it would be more difficult to supply power for the pre-amplifier stages from the output stage.

Although the output stage described in the particular embodiment does not employ a separate phase inverter or a push-pull output transformer, circuits including such arrangements in the output stage are included with the scope of the present invention.

I claim:

1. An electrical amplifier including a pre-amplifier stage having a signal input, an output and a power supply connection, an amplifying stage having an input and an output, the input of the amplifying stage being connected to the output of the pre-amplifier stage, a transistor output stage arranged to be operated in class B and having two complementary transistors connected to provide a push-pull output, the output stage having an input connected to the output of the amplifying stage and an output, a constant current generator connector to the output of the amplifying stage and an electrical connection connected between the output of the output stage and the power supply connection of the pre-amplifier stage to supply power to the pre-amplifier stage.

2. An electrical amplifier as claimed in claim 1, in which the two transistors are connected in the common collector configuration.

3. An electrical amplifier as claimed in claim 1 including a negative feedback connection between the output of the output stage and the input to the amplifying stage.

4. An electrical amplifier as claimed in calim 1, further comprising an integrating circuit connected to said electrical connection.

5. An electrical amplifier as claimed in claim 1 in which the pre-amplifier stage includes an input stage having an input and an output, a negative feedback connection between said output and said input of the input stage and a ratio network in the feedback connection."

6. An electrical amplifier as claimed in claim 1 in which the transistors are connected in the common emitter configuration.

References Cited

UNITED STATES PATENTS

| | | | |
|---|---|---|---|
| 2,885,498 | 5/1959 | Bruck et al. | 330—13 |
| 3,023,368 | 2/1962 | Erath | 330—17 X |
| 3,319,086 | 5/1967 | Yee | 330—13 X |

ROY LAKE, Primary Examiner

S. H. GRIMM, Assistant Examiner

U.S. Cl. X.R.

330—14, 15, 17, 22, 28, 40